(12) United States Patent
Liu et al.

(10) Patent No.: US 8,684,775 B2
(45) Date of Patent: Apr. 1, 2014

(54) ELECTRICAL CONNECTOR AND TERMINAL THEREOF

(75) Inventors: Jun Liu, Guangzhou (CN); Yong Quan Wu, Guangzhou (CN)

(73) Assignee: Lotes Co., Ltd., Keelung (TW)

( * ) Notice: Subject to any disclaimer, the term of this patent is extended or adjusted under 35 U.S.C. 154(b) by 66 days.

(21) Appl. No.: 13/564,527

(22) Filed: Aug. 1, 2012

(65) Prior Publication Data

US 2013/0273779 A1 Oct. 17, 2013

(30) Foreign Application Priority Data

Apr. 13, 2012 (CN) ...................... 2012 2 0153947 U

(51) Int. Cl.
*H01R 4/48* (2006.01)

(52) U.S. Cl.
USPC ........................................................ 439/862

(58) Field of Classification Search
CPC ............... H01R 13/24; H01R 13/2435; H01R 13/2442; H01R 13/245; H01R 13/2457
USPC ........................................ 439/862, 71–73, 66
See application file for complete search history.

(56) References Cited

U.S. PATENT DOCUMENTS

| 6,315,621 | B1 * | 11/2001 | Natori et al. ................... | 439/862 |
| 6,398,598 | B2 * | 6/2002 | Masumoto ..................... | 439/862 |
| 6,955,572 | B1 * | 10/2005 | Howell .......................... | 439/862 |
| 6,976,851 | B2 * | 12/2005 | Huang ............................ | 439/66 |
| 7,651,381 | B2 * | 1/2010 | Chuang ......................... | 439/862 |

* cited by examiner

*Primary Examiner* — Xuong Chung Trans
(74) *Attorney, Agent, or Firm* — Morris Manning & Martin LLP; Tim Tingkang Xia, Esq.

(57) ABSTRACT

An electrical connector includes an insulating body provided with a plurality of receiving holes, and a plurality of terminals respectively received in the receiving holes. Each of the terminals has a base and at least one elastic arm bent upwards and extending from the base. The elastic arm is provided with a contact portion. When the contact portion receives a force in a first stage, the elastic arm is deformed mainly due to compression, and when the contact portion continuously receives a force in a second stage, the elastic arm is deformed mainly due to bending. The normal force received by the terminal is rapidly increased in the first stage, and is reduced and maintained at the low level in the second stage.

15 Claims, 5 Drawing Sheets

ELECTRICAL CONNECTOR AND TERMINAL THEREOF

CROSS-REFERENCE TO RELATED APPLICATIONS

This non-provisional application claims priority under 35 U.S.C. §119(a) on Patent Application No. 201220153947.2 filed in P.R. China on Apr. 13, 2012, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an electrical connector and a terminal thereof, and more particularly to an electrical connector for electrically connecting a chip module to a circuit board and a terminal thereof.

BACKGROUND OF THE INVENTION

Chinese Patent No. CN200520113907.5 discloses an electrical connector, which includes an insulating body provided with a plurality of receiving slots, and a plurality of terminals respectively received in the receiving slots. Each of the terminals includes a base fixed in the receiving slot and an arm portion bent upwards and extending from the base. The arm portion includes a first C-shaped bent portion bent upwards and extending from a top edge of the base, and a second C-shaped bent portion bent upwards in a direction opposite to the first C-shaped bent portion, and a connecting section is formed between the first C-shaped bent portion and the second C-shaped bent portion. The second C-shaped bent portion extends obliquely upwards to form an extending section. A contact portion is located at one end of the extending section. The length of the connecting section is substantially equal to that of the extending section, and the contact portion is always maintained above the first C-shaped bent portion. In a process of pressing a chip module to the contact portion, the contact portion basically moves straight down, and the arm portion of the terminal undergoes a small lateral displacement.

The electrical connector further includes a fastener for fastening the chip module to the insulating body.

In the process of pressing the chip module to the terminals, the terminal is deformed mainly due to compression. Along with downward deformation of the terminal, the compression force gradually increases. Accordingly, the normal force received by the terminal gradually increases, where the normal force substantially rises linearly.

Due to the manufacturing tolerance of the terminals and the assembly tolerance of the terminals assembled to the electrical connector, the contact portions of the terminals are at different heights and not in the same plane, so that the chip module needs to be pressed downward by a long stroke in order to overcome the tolerances. If a short downward pressing stroke is applied to the terminals, the downward pressing stroke is insufficient to enable all the terminals to be in stable contact with the chip module, resulting in a poor contact.

In addition, currently in the industry, the number of terminals in the electrical connector becomes increasingly large, and the fastener needs to be pressed downwards by a long stroke to enable the terminals to be in close contact with the chip module. However, the long downward pressing stroke causes a large normal force, which leads to a large total normal force by the terminals in the connector, which easily causes damage to the fastener in the pressing process. Moreover, when intending to fasten the fastener, an operator or a user needs to operate the fastener with a large force, which makes the operation difficult, and affects adversely the durability of the connector and the fastener.

Therefore, a heretofore unaddressed need exists in the art to address the aforementioned deficiencies and inadequacies.

SUMMARY OF THE INVENTION

In one aspect, the present invention is directed to an electrical connector and a terminal thereof that is capable of increasing the normal force rapidly and then maintaining a low normal force.

In one embodiment, an electrical connector according to the present invention includes: an insulating body, provided with a plurality of receiving holes, and a plurality of terminals, respectively received in the receiving holes. Each of the terminals has a base fixed in the receiving hole, a first elastic arm bent upwards and extending from the base, and a second elastic arm further bent upwards and extending in a direction opposite to the first elastic arm. The first elastic arm is arc-shaped. The second elastic arm has an arc-shaped bent section and an extending section extending obliquely upwards from one end of the bent section. One end of the extending section has a contact portion. A connecting section connects the bent section and the first elastic arm. When the contact portion is pressed in a first stage, the first elastic arm is forced to be compressed, and the connecting section undergoes a downward displacement. When the contact portion is pressed in a second stage, the first elastic arm is forced to be stretched, and the connecting section undergoes an upward displacement.

Further, the length of the connecting section is far smaller than that of the extending section.

Further, the radius of the first elastic arm is greater than that of the bent section.

Further, the receiving hole is provided therein with a stopping portion. The stopping portion is located at one side of the second elastic arm. In the first stage, the second elastic arm presses against the stopping portion.

Further, the extending section is substantially rectilinear. In the first stage, the extending section is close to an upright state. In the second stage, the extending section is close to a horizontal state.

Further, in the first stage, the contact portion is substantially maintained within an upward projection range of the first elastic arm. In the second stage, the contact portion is distal from the upward projection range of the first elastic arm.

In another embodiment, an electrical connector according to the present invention includes: an insulating body, provided with a plurality of receiving holes, and a plurality of terminals, respectively received in the receiving holes. Each of the terminals has a base fixed in the receiving hole, a first elastic arm bent upwards and extending from the base, and a second elastic arm further bent upwards and extending in an opposite direction. The second elastic arm is provided with a contact portion exposed out of the receiving hole. When the contact portion is pressed in a first stage, the contact portion is substantially located within an upward projection range of the first elastic arm. When the contact portion is pressed in a second stage, the contact portion is moved out of the upward projection range of the first elastic arm.

Further, the receiving hole is provided therein with a stopping portion. The stopping portion is located at one side of the second elastic arm. In the first stage, the second elastic arm presses against the stopping portion.

Further, the second elastic arm includes a bent section and an extending section extending obliquely upwards from the bent section. The contact portion is located at one end of the extending section.

Further, a connecting section connects the first elastic arm and the bent section. In the first stage, the first elastic arm is forced to be compressed, the connecting section undergoes a downward displacement, and the contact portion is substantially maintained within the projection range. In the second stage, the first elastic arm is forced to be stretched, the connecting section undergoes an upward displacement, and the contact portion is moved outwards away from the projection range.

Further, both the first elastic arm and the bent section are arc-shaped, and the radius of the first elastic arm is greater than that of the bent section.

Further, the length of the connecting section is far smaller than that of the extending section.

Further, the extending section is close to an upright state in the first stage, and is close to a horizontal state in the second stage.

In a further embodiment, a terminal according to the present invention includes: a base, and at least one elastic arm bent upwards and extending from the base. The elastic arm is provided with a contact portion. When the contact portion receives a force in a first stage, the elastic arm is deformed mainly due to axial compression. When the contact portion continuously receives a force in a second stage, the elastic arm is deformed mainly due to lateral bending.

Further, the elastic arm includes a first elastic arm bent upwards and extending from the base, and a second elastic arm further bent upwards and extending in a direction opposite to the first elastic arm.

Further, the contact portion is located on the second elastic arm. In the first stage, the contact portion is maintained within an upward projection range of the first elastic arm, and the first elastic arm and the second elastic arm as a whole are axially compressed and deformed. In the second stage, the contact portion is distal from the upward projection range of the first elastic arm, and the first elastic arm and the second elastic arm as a whole are laterally bent and deformed.

Further, the second elastic arm includes a bent section and an extending section extending obliquely upwards from the bent section, and the contact portion is located at one end of the extending section.

Further, both the first elastic arm and the bent section are arc-shaped, and the radius of the first elastic arm is greater than that of the bent section.

Further, a connecting section connects the first elastic arm and the second elastic arm. In the first stage, the first elastic arm is forced to be compressed, and the connecting section undergoes a downward displacement. In the second stage, the first elastic arm is forced to be stretched, and the connecting section undergoes an upward displacement.

Further, the extending section is close to an upright state in the first stage, and is close to a horizontal state in the second stage.

As compared with the related art, the present invention, among other things, has the following beneficial effects.

When the contact portion receives a force in the first stage, the elastic arm is deformed mainly due to axial compression, and when the contact portion continuously receives a force in the second stage, the elastic arm is deformed mainly due to lateral bending. The normal force received by the terminal in the first stage is increased rapidly, and stable contact can be achieved with a short downward pressing stroke. In the second stage, in the process where the downward pressing stroke is continuously increased, the normal force received by the terminal is reduced and maintained at the low level, so that the total normal force received by the electrical connector is small and stable. Therefore, the pressure received by the fastener is small, so that the fastener will not be damaged, and can be operated by the user easily, thereby improving the durability of the connector and the fastener.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
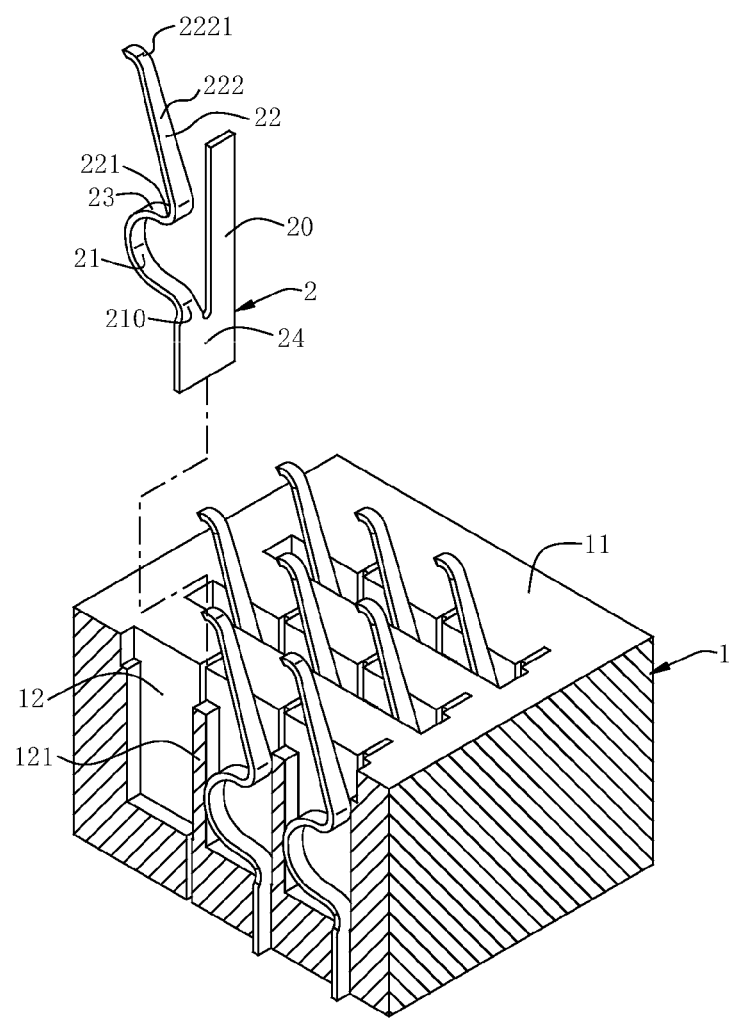
FIG. 1 is a schematic three-dimensional exploded view of an electrical connector according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

Referring to FIG. 1, an electrical connector 100 according to one embodiment of the present invention includes an insulating body 1, and a plurality of terminals 2 disposed in the insulating body 1.

The insulating body 1 has a top surface 11, and a plurality of receiving holes 12 formed downwards from the top surface 11 through the insulating body 1. Each of the receiving holes 12 is provided therein with a stopping portion 121. In this embodiment, the stopping portion 121 is an inner wall of the receiving hole 12. In other embodiments, the stopping portion 121 may be a projecting portion protruding from the inner wall of the receiving hole 12, and is not limited to a particular shape.

The terminal 2 has an upright base 20 fixed in the receiving hole 12. A first elastic arm 21 is bent upwards and extends from the base 20, and a first fulcrum 210 is formed at the bent position. The first elastic arm 21 is substantially semicircular-shaped, is opened rightwards, and has a large radius. A second elastic arm 22 is further bent upwards and extends from the first elastic arm 21. The bending direction of the second elastic arm 22 is opposite to that of the first elastic arm 21. The second elastic arm 22 is located at a left side of the stopping portion 121 and is corresponding to the stopping portion 121. The second elastic arm 22 has a bent section 221 and an extending section 222. The bent section 221 is arc-shaped, is opened leftwards, and has a radius far smaller than that of the first elastic arm 21. In another embodiment, the radius of the bent section 221 may be equal to that of the first elastic arm 21. In other embodiments, the radius of the bent section 221 may be slightly greater than that of the first elastic arm 21. The extending section 222 is inclined leftwards from one end of the bent section 221 and extends upwards to exceed the top surface 11. The extending section 222 is substantially rectilinear, forms a small acute angle with the base 20, and is close to an upright state. One end of the extending section 222 is provided with a contact portion 2221. The contact portion 2221 is exposed out of the receiving hole 12, and is substantially located within an upward projection range of the first elastic arm 21. A connecting section 23 connects the bent section 221 and the first elastic arm 21, and the length of the connecting section 23 is far smaller than that of the extending section 222. The terminal 2 further has a soldering portion 24 extending downwards from the base 20.

Figure 2:
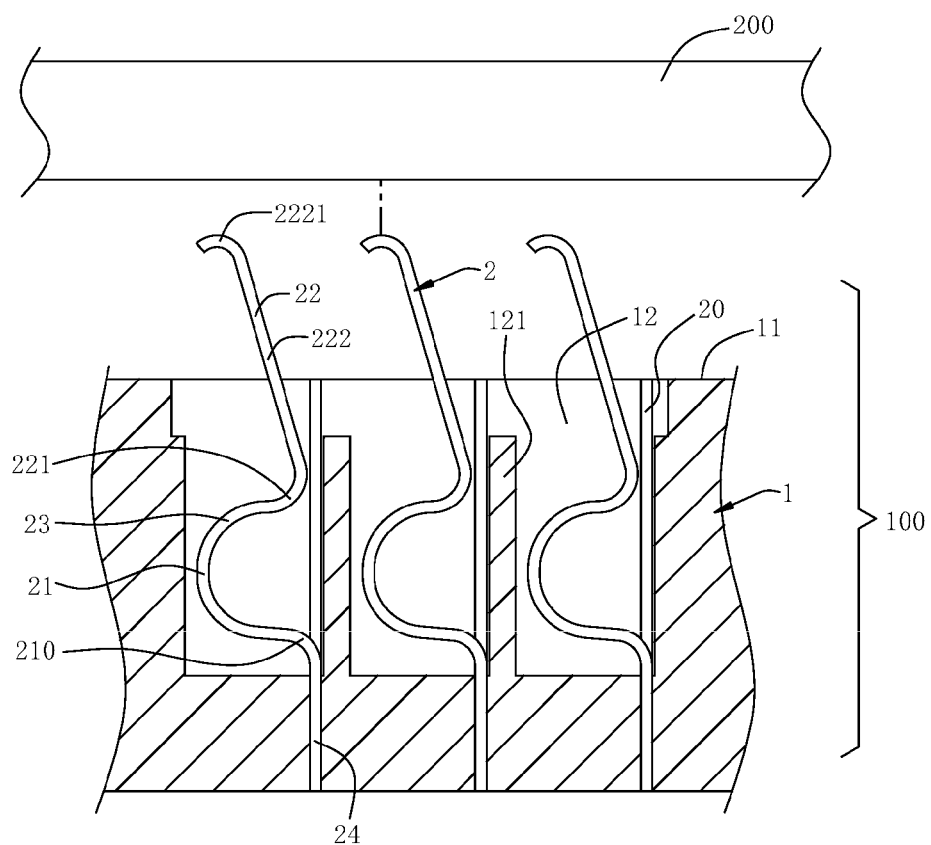
FIG. 2 is a schematic sectional side view of the electrical connector according to one embodiment of the present invention.

Referring now to FIG. 2, the electrical connector 100 is used for electrically connecting a chip module 200 to a circuit board (not shown), so that the contact portion 2221 is in electrical contact with the chip module 200, and the soldering portion 24 is soldered to the circuit board.

When the chip module 200 presses the contact portions 2221 downwards, the deformation of the terminal 2 is divided into two stages.

Figure 3:
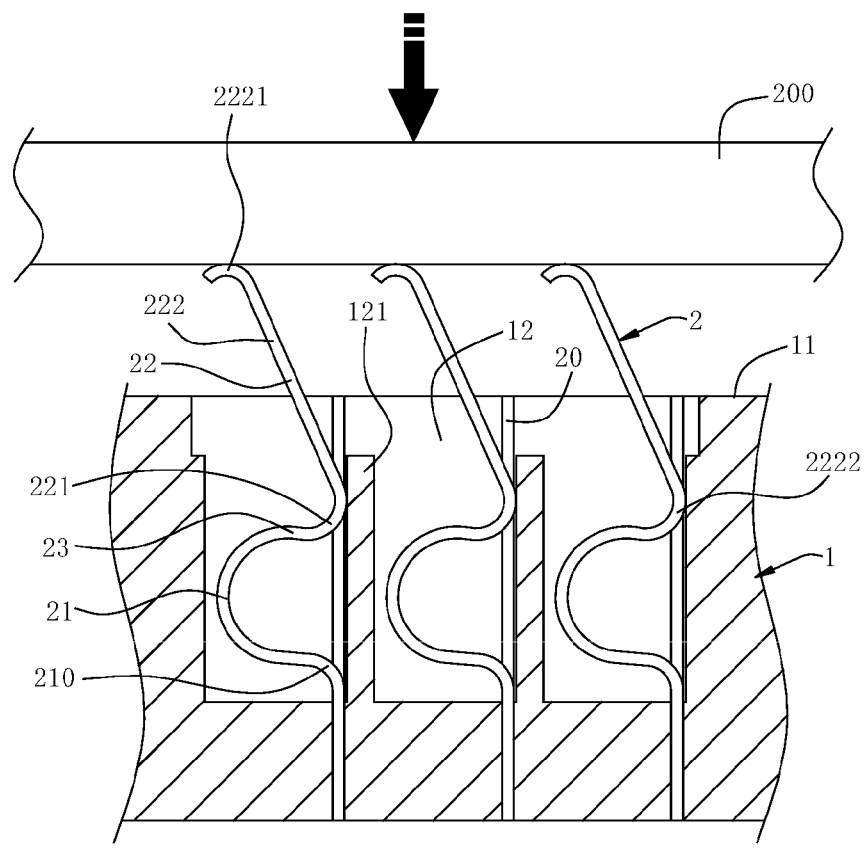
FIG. 3 is a schematic sectional side view of the electrical connector according to one embodiment of the present invention in a first stage.

Referring to FIG. 3, in a first stage, that is, in an early stage when the chip module 200 presses the contact portions 2221, the chip module 200 presses the contact portions 2221 with a downward force and a leftward force. Since the extending section 222 forms a small acute angle with the base 20 and is close to the upright state, the leftward force is small, and the downward force is large. The downward force is transmitted to the first elastic arm 21 through the second elastic arm 22, and since the first elastic arm 21 has a large arc radius, the first elastic arm 21 can absorb the downward force, so that the first elastic arm 21 is axially compressed and deformed downwards under the downward force to drive the connecting section 23 to undergo a downward displacement, so as to drive the second elastic arm 22 to undergo a downward and rightward displacement. In this process, the leftward force is applied to the terminal 2, so that the extending section 222 is moved leftwards. However, since the leftward force is small, the leftward displacement of the extending section 222 is small, and the contact portion 2221 is substantially maintained within the upward projection range of the first elastic arm 21 in the whole first stage, that is, the contact portion 2221 is located within the upward projection range of the first elastic arm 21. However, the cases where the contact portion 2221 is partially exposed out of the projection range due to reasons such as manufacturing tolerance also belong to the scope of the present invention. In the first stage, due to the downward force, the first elastic arm 21 and the second elastic arm 22 as a whole are moved downwards, and the terminal 2 is deformed mainly due to axial compression. Since a large counteraction force exists in the case of deformation due to axial compression, the normal force received by the terminal 2 is increased rapidly in the first stage, so that good contact between the chip module 200 and the terminals 2 can be achieved with a short downward pressing stroke.

Figure 4:
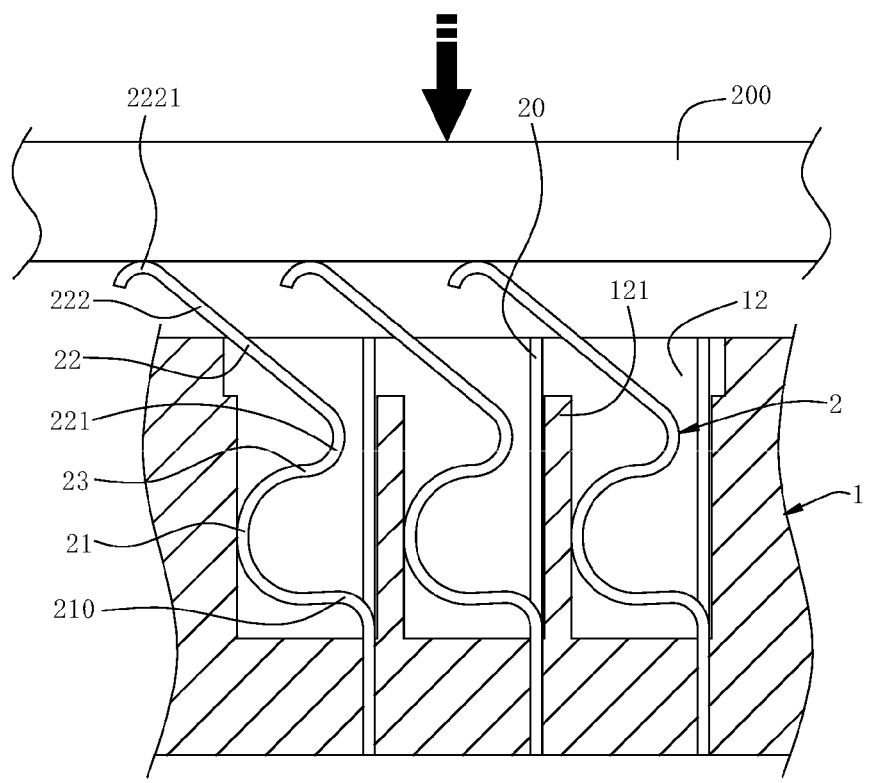
FIG. 4 is a schematic sectional side view of the electrical connector according to one embodiment of the present invention in a second stage.

Referring to FIG. 4, in a second stage, that is, in a later stage when the chip module 200 presses the contact portions 2221, as the terminal 2 is continuously pressed downwards, the contact portion 2221 is moved leftwards away from the upward projection range of the first elastic arm 21, and the extending section 222 is also moved leftwards to be more inclined and to form a larger angle with the base 20. Accordingly, the leftward force is gradually increased, and the downward force is gradually decreased, so that the normal force received by the terminal 2 is reduced. When the leftward force is greater than the downward force, the first elastic arm 21 and the second elastic arm 22 as a whole are rotated leftwards about the first fulcrum 210, and are laterally bent and deformed, where the second elastic arm 22 is bent and deformed leftwards to drive the connecting section 23 to undergo an upward displacement, so that the first elastic arm 21 is also stretched and rotated leftwards. Since the downward force is gradually decreased, the downward displacement of the first elastic arm 21 and the second elastic arm 22 is small, and since the first elastic arm 21 absorbs the downward force, the terminal 2 is deformed mainly due to lateral bending in the second stage. In this process, the extending section 222 is pressed by the chip module 200 to be increasingly lower, and finally is close to a horizontal state, and the downward pressure is maintained at a stable level, so that the normal force received by the terminal 2 is stably maintained at a small level, and therefore, the pressure received by the fastener is small, and the force required by the operator to operate the fastener is small, facilitating operation of the fastener.

From another perspective, when the chip module 200 presses the contact portions 2221 in the first stage, since the extending section 222 forms a small angle with the downward pressing direction of the chip module 200, the downward pressure causes a large force in a direction parallel to the extending section 222, and a small force in a direction perpendicular to the extending section 222. The large force parallel to the extending section 222 causes axial compression of the extending section 222, and therefore, the counteraction force presented on the extending section 222 is mainly the counteraction force to axial compression. When the chip module 200 presses the contact portions 2221 in the second stage, since the extending section 222 forms a large angle with the downward pressing direction of the chip module 200, the downward pressure causes a significant force in a direction perpendicular to the extending section 222. The significant force perpendicular to the extending section 222 causes lateral bending of the extending section 222, and therefore, the extending section 222 presents a significant counteraction force to lateral bending. An elongated material has a large counteraction force when being axially compressed and has a small counteraction force when being laterally bent. Therefore, the total counteraction force of the extending section 222 is large in the first stage which is mainly the counteraction force to axial compression, and the counteraction force of the extending section 222 can be maintained at a low level in the second stage where lateral bending is significant. The stress of the terminal 2 is similar to that of the extending section 222. In view of the overall deformation of the terminal 2, in the case that the terminal 2 is deformed in the first stage mainly due to axial compression and is deformed in the second stage mainly due to lateral bending, a large counteraction force is provided in the first stage, and a low counteraction force is maintained in the second stage.

Referring to FIGS. 3 and 4, in this embodiment, the second elastic arm 22 presses against the stopping portion 121 in the first stage to prevent the second elastic arm 22 from being excessively pressed to cause deformation. A second fulcrum 2222 is formed at the position where the second elastic arm 22 presses against the stopping portion 121. When the second elastic arm 22 presses against the stopping portion 121, the fulcrum of deformation of the terminal 2 is changed from the first fulcrum 210 to the second fulcrum 2222, so that the arms of force of the second elastic arm 22 and the first elastic arm 21 are reduced. In this way, in the first stage, a short arm of force enables the normal force received by the terminal 2 to be increased rapidly, so as to meet user requirements. In the second stage, the second elastic arm 22 departs from the stopping portion 121, and the fulcrum of deformation of the terminal 2 is changed from the second fulcrum 2222 back to the first fulcrum 210, so as to provide a long arm of force. In addition, since the first elastic arm 21 is of an arc shape having a large radius and has good elasticity, the first elastic arm 21 absorbs a part of the normal force, so that the normal force received by the terminal 2 is maintained at a low level.

In other embodiments, the receiving holes 12 are not provided therein with the stopping portions 121. The first elastic arm 21 and the second elastic arm 22 are under a downward pressure of the chip module 200. In the first stage, the downward force is far greater than the leftward force, and the terminal 2 is deformed due to axial compression. In the second stage, the leftward force is greater than the downward force, and the terminal 2 is deformed due to lateral bending.

Figure 5:
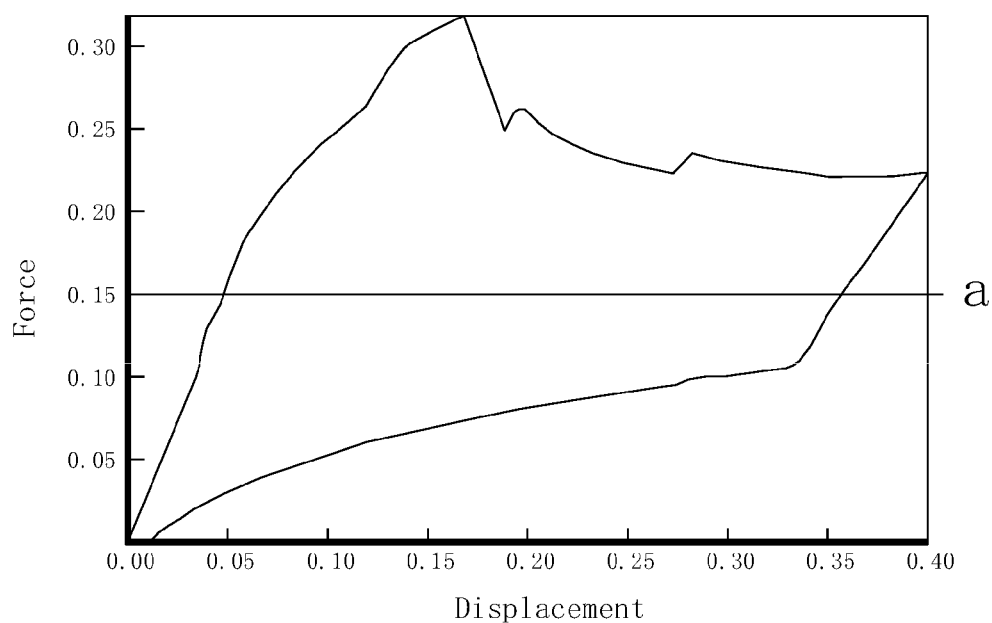
FIG. 5 is a schematic view illustrating the change of a normal force received by terminals of the electrical connector according to one embodiment of the present invention.

Referring to FIG. 5, when the chip module 200 presses the terminals 2, each of the terminals 2 receives a force. In the first stage, the normal force received by the terminal 2 is increased rapidly, so that good contact between the terminals 2 and the chip module 200 can be achieved rapidly. The maximum value of the increased normal force is far greater than the contact force required for stable contact between the terminals 2 and the chip module 200 (as shown by Line a in FIG. 5), so that all the terminals 2 can be maintained in good contact with the chip module 200. From the first stage to the second stage, the normal force received by the terminal 2 decreases from the maximum value to a stable level, and in the second stage, the normal force of the terminal 2 is stably maintained at a low level. In this process, the terminals 2 are still maintained in stable contact with the chip module 200. Meanwhile, since the normal force received by the terminal 2 is finally maintained at a low level, the pressure received by the fastener is small, and does not damage the fastener, and the force required by the user to operate the fastener is also small, facilitating operation.

Based on the above, the electrical connector 100 according to the present invention, among other things, has the following beneficial effects.

(1) When the contact portion 2221 receives a force in the first stage, the elastic arm is deformed mainly due to axial compression, and the normal force received by the terminal 2 is increased rapidly, so that the terminals 2 can be maintained in good contact with the chip module 200 rapidly. The maximum value of the increased normal force is far greater than the contact force required for stable contact between the terminal 2 and the chip module 200, so that all the terminals 2 in the electrical connector 100 can be maintained in good contact with the chip module 200.

(2) In the second stage, the elastic arm is deformed mainly due to lateral bending, and the normal force received by the terminal 2 is reduced and maintained at the low level, so that the normal force received by the electrical connector 100 is small and stable. Therefore, the pressure finally received by the fastener is small, the fastener will not be damaged due to excessive pressure, and the operator can operate the fastener with a small force, facilitating operation.

(3) The second elastic arm 22 presses against the stopping portion 121 in the first stage, so that the fulcrum of deformation of the terminal 2 is changed from the first fulcrum 210 to the second fulcrum 2222, and the arms of force of the second elastic arm 22 and the first elastic arm 21 are reduced. In this way, in the first stage, a short arm of force enables the terminal 2 to receive a large normal force, which can be increased rapidly, so as to meet user requirements. The second elastic arm 22 presses against the stopping portion 121 in the first stage to prevent the second elastic arm 22 from causing deformation of the terminal 2 when the terminal 2 is pressed downwards rapidly.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
   an insulating body, provided with a plurality of receiving holes; and
   a plurality of terminals, respectively received in the receiving holes, wherein each of the terminals has a base fixed in the receiving hole, a first elastic arm bent upwards and extending from the base, and a second elastic arm further bent upwards and extending in a direction opposite to the first elastic arm,
   wherein the first elastic arm is arc-shaped, the second elastic arm has an arc-shaped bent section and an extending section extending obliquely upwards from one end of the bent section, one end of the extending section has a contact portion, and a connecting section connects the bent section and the first elastic arm;
   wherein the length of the connecting section is far smaller than that of the extending section;

when the contact portion is pressed in a first stage, the first elastic arm is forced to be compressed, and the connecting section undergoes a downward displacement; and when the contact portion is pressed in a second stage, the first elastic arm is forced to be stretched, and the connecting section undergoes an upward displacement.

2. The electrical connector according to claim 1, wherein the radius of the first elastic arm is greater than that of the bent section.

3. The electrical connector according to claim 1, wherein the receiving hole is provided therein with a stopping portion, the stopping portion is located at one side of the second elastic arm, and in the first stage, the second elastic arm presses against the stopping portion.

4. The electrical connector according to claim 1, wherein the extending section is substantially rectilinear, in the first stage, the extending section is close to an upright state, and in the second stage, the extending section is close to a horizontal state.

5. The electrical connector according to claim 1, wherein in the first stage, the contact portion is substantially maintained within an upward projection range of the first elastic arm, and in the second stage, the contact portion is distal from the upward projection range of the first elastic arm.

6. An electrical connector, comprising:
an insulating body, provided with a plurality of receiving holes; and
a plurality of terminals, respectively received in the receiving holes, wherein each of the terminals has a base fixed in the receiving hole, a first elastic arm bent upwards and extending from the base, and a second elastic arm further bent upwards and extending in an opposite direction,
wherein the second elastic arm comprises a bent section and an extending section extending obliquely upwards from the bent section, and a contact portion is located at one end of the extending section and exposed out of the receiving hole;
wherein a connecting section connects the first elastic arm and the bent section, and the length of the connecting section is far smaller than that of the extending section;
when the contact portion is pressed in a first stage, the contact portion is substantially located within an upward projection range of the first elastic arm; and
when the contact portion is pressed in a second stage, the contact portion is moved out of the upward projection range of the first elastic arm.

7. The electrical connector according to claim 6, wherein the receiving hole is provided therein with a stopping portion, the stopping portion is located at one side of the second elastic arm, and in the first stage, the second elastic arm presses against the stopping portion.

8. The electrical connector according to claim 6, wherein in the first stage, the first elastic arm is forced to be compressed, the connecting section undergoes a downward displacement, and the contact portion is substantially maintained within the projection range, and in the second stage, the first elastic arm is forced to be stretched, the connecting section undergoes an upward displacement, and the contact portion is moved outwards away from the projection range.

9. The electrical connector according to claim 6, wherein both the first elastic arm and the bent section are arc-shaped, and the radius of the first elastic arm is greater than that of the bent section.

10. The electrical connector according to claim 6, wherein the extending section is close to an upright state in the first stage, and is close to a horizontal state in the second stage.

11. A terminal, comprising:
a base;
a first elastic arm bent upwards and extending from the base; and
a second elastic arm bent upwards from the first elastic arm and extending in a direction opposite to the first elastic arm,
wherein the second elastic arm comprises a bent section and an extending section extending obliquely upwards from the bent section, and a contact portion is located at one end of the extending section;
wherein a connecting section connects the first elastic arm and the second elastic arm, and the length of the connecting section is far smaller than that of the extending section; and
wherein when the contact portion receives a force in a first stage, the first elastic arm and the second elastic arm as a whole are deformed mainly due to axial compression, and when the contact portion continuously receives a force in a second stage, the first elastic arm and the second elastic arm as a whole are deformed mainly due to lateral bending.

12. The terminal according to claim 11, wherein in the first stage, the contact portion is maintained within an upward projection range of the first elastic arm, and in the second stage, the contact portion is distal from the upward projection range of the first elastic arm.

13. The terminal according to claim 11, wherein both the first elastic arm and the bent section are arc-shaped, and the radius of the first elastic arm is greater than that of the bent section.

14. The terminal according to claim 11, wherein in the first stage, the first elastic arm is forced to be compressed, and the connecting section undergoes a downward displacement, and in the second stage, the first elastic arm is forced to be stretched, and the connecting section undergoes an upward displacement.

15. The terminal according to claim 11, wherein the extending section is close to an upright state in the first stage, and is close to a horizontal state in the second stage.

* * * * *